(12) United States Patent
Solomko et al.

(10) Patent No.: US 9,698,833 B2
(45) Date of Patent: Jul. 4, 2017

(54) VOLTAGE STANDING WAVE RADIO MEASUREMENT AND TUNING SYSTEMS AND METHODS

(71) Applicant: Infineon Technologies AG, Neubiberg (DE)

(72) Inventors: Valentyn Solomko, Munich (DE); Ruediger Bauder, Feldkirchen-Westerham (DE); Winfried Bakalski, Munich (DE); Anthony Thomas, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/942,105

(22) Filed: Nov. 16, 2015

(65) Prior Publication Data
US 2017/0141802 A1    May 18, 2017

(51) Int. Cl.
*H04B 1/04* (2006.01)
*G01R 27/06* (2006.01)
*H04B 5/00* (2006.01)

(52) U.S. Cl.
CPC ............ *H04B 1/0458* (2013.01); *G01R 27/06* (2013.01); *H04B 5/0037* (2013.01)

(58) Field of Classification Search
CPC ........ H01Q 1/2225; H01Q 1/24; H01Q 23/00; H04B 1/04; H04B 5/0062; H04B 7/10; H04B 1/0458; H04B 5/0037; H04B 1/1027; H04B 2001/1072; H04B 17/0027; G01R 27/06; H03J 7/02; H03J 2200/06
See application file for complete search history.

(56) References Cited

U.S. PATENT DOCUMENTS

| | | | |
|---|---|---|---|
| 2009/0274072 A1* | 11/2009 | Knox ................... | H04B 5/0062 370/278 |
| 2010/0085260 A1* | 4/2010 | McKinzie ............. | H01Q 23/00 343/703 |
| 2011/0086600 A1* | 4/2011 | Muhammad ......... | H04B 1/0458 455/120 |

* cited by examiner

*Primary Examiner* — Thanh Le
(74) *Attorney, Agent, or Firm* — Eschweiler & Potashnik, LLC

(57) ABSTRACT

A standing wave ratio detection arrangement is disclosed. The arrangement includes a standing wave ratio detector and a controller. The standing wave ratio detector is configured to receive an isolated signal and a coupled signal and to generate a multi-bit return loss signal based on the isolated signal and the coupled signal in the analog domain using successive attenuation of the coupled signal. The controller is configured to determine a standing wave ratio from the return loss and to generate an antenna tuner control signal using the standing wave ratio.

20 Claims, 11 Drawing Sheets

VOLTAGE STANDING WAVE RADIO MEASUREMENT AND TUNING SYSTEMS AND METHODS

BACKGROUND

Mobile communication devices generate and receive RF signals using integrated antennas. Operation of these devices is dependent upon characteristics of the antenna, signals, frequencies, and environmental conditions. These characteristics can impact talk time, power consumption, dropped calls and the like.

One characteristic is the impedance or impedance matching of the integrated antennas and RF generation circuitry. The impedance of the antenna can vary according to factors such as, frequency, temperature, signal strength, environmental conditions and the like. If there is an impedance mismatch, excess power consumption and weak signals can be generated. From a user's perspective, impedance mismatch can lead to a reduction in talk time, short battery life and dropped calls.

In order to enhance power transfer to transmitted signals, impedance matching between a RF generation circuitry and integrated antennas is needed.

DETAILED DESCRIPTION

Figure 1:
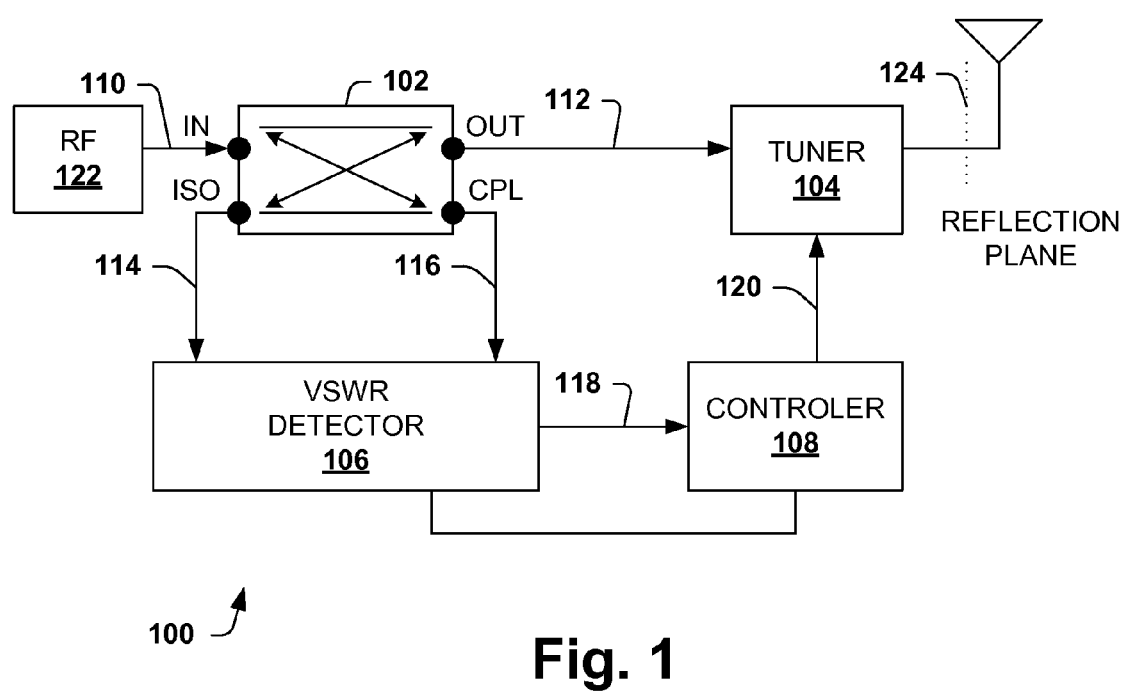
FIG. 1 is a block diagram illustrating an antenna tuning arrangement using analog standing wave ratio detection.

The present invention will now be described with reference to the attached drawing figures, wherein like reference numerals are used to refer to like elements throughout, and wherein the illustrated structures and devices are not necessarily drawn to scale.

Impedance matching is used to match an impedance of an antenna or load with signal generation circuitry. Power transfer, signal generation and the like are improved when there is impedance matching.

One technique to provide impedance matching is to incorporate an antenna tuning system. The antenna tuning system measures the amplitude and/or phase of RF signals transmitted to the antenna and reflected back from the antenna. The measurements are provided to an RF front end controller, which adjusts a tuning impedance for the antenna to enhance impedance matching.

One parameter based on the measurements is a standing wave ratio, which is used by the RF front end controller to alter the tuning impedance. In one example, a directional coupler is attached to the RF line and power detectors are attached to coupled and isolated ports of a directional coupler. The detected power is digitized and processed in a digital domain to extract information associated with the standing wave ratio. This approach requires multiple analog to digital converters that are isolated and well matched in order to post-process the signal correctly. Additionally, this approach requires complex mathematical operations, such as division, logarithmic operations, temperature compensation for diode curves and the like. Furthermore, this approach, including multiple analog to digital converters and complex digital processing, requires substantial silicon area and current or power.

The systems and methods described below utilize analog power detectors and a comparator to generate a return loss and a voltage standing wave ratio (VSWR) in an RF line or system. The VSWR is a measure of impedance matching of loads (e.g., at an antenna) to the impedance of RF generation circuitry. The VSWR is the ratio of the partial wave partial standing wave's amplitude at a maximum to the amplitude at a minimum. The VSWR can be used by an RF front end controller to adjust an antenna tuner and facilitate impedance matching between the RF circuit and the antenna.

FIG. 1 is a block diagram illustrating an antenna tuning arrangement 100 using analog standing wave ratio detection. The standing wave ratio is used to enhance or improve impedance matching.

The arrangement 100 includes a directional coupler 102, an antenna tuner 104, a VSWR detector 106, and an RF front end controller 108. The arrangement 100 determines a standing wave ratio for a generated RF signal 110 that is used to enhance or improve impedance matching. The standing wave ratio is based on RF generation circuitry 122 and its antenna and reflection plane 124.

The directional coupler 102 has four ports, an input port IN, an output port OUT, an isolated port ISO and a coupled port CPL. The line between the IN port and the OUT port is the main line and the line between the CPL port and the ISO port is the coupled line.

The coupler 102 has a selected coupling factor based on the output power at the CPL port Pcpl versus the input power at the IN port Pin. The coupler 102 has an isolation based on the power at the ISO port Piso and the power and the IN port Pin. The coupler 102 has an insertion loss defined as the power loss at the IN port Pin to the OUT port Pout.

The directional coupler 102 receives an RF input signal 110 at the IN port and generates an RF output signal 112 at the OUT port, an isolated signal 114 at the ISO port and a coupled signal 116 at the CPL port. RF generation circuitry 122 generates the RF input signal 110. The RF generation circuitry 122 has an impedance that varies during operation.

The coupled signal 116 is also referred to as a forward signal and the isolated signal 114 is also referred to as a reverse signal.

The directional coupler 102 provides the RF output signal 112 as substantially unaltered from the input signal 110. The RF output signal 112 is provided to the antenna tuner 104 for transmission via an antenna or multiple antennas.

The directional coupler 102 generates the coupled signal 116 at the CPL port attenuated or reduced by coupling factor. The isolated signal 114 is generated at the ISO port with the selected isolation.

The VSWR detector 106 receives the isolated signal 114 and the coupled signal 116. The VSWR detector 106 omits analog to digital conversion and uses analog components to generate a return loss (RL) 118. The detector 106 is configured to attenuate at least the coupled signal 114 and obtain power measurements based on the coupled signal 114 and the isolated signal 114. The detector 106 performs a comparison of the power measurements to generate the return loss RL 118. The return loss RL 118 is based on the reflection plane 124. The return loss RL 118 measures an effectiveness of power delivery from RF circuitry 122 to a load or antenna in terms of power out (Pout) from the OUT port and power reflected back via the reflection plane 124.

The return loss 118 is provided to the controller 108. The controller 108 is configured to analyze the return loss 118 and generate an antenna tuner control 120 based on the signal 118. It is appreciated that the detector and/or the controller 108 can calculate the VSWR from the return loss 118 and generate the antenna tuner control 120 based on the VSWR instead of the return loss RL. The controller 108 can be implemented in circuitry and use one or more processors and/or memory to perform the analysis and generate the control signal 120. The control signal 120 is generated to enhance impedance matching. The controller 108 can also be involved in operation of the VSWR detector 106.

The antenna tuner 104 is configured to improve power transfer between RF generation circuitry 122 and the antenna. The antenna tuner 104 improves the power transfer by enhancing or improving matching of the impedance of the RF generation circuitry 122 and the antenna. The antenna tuner 104 adjusts an impedance seen by the antenna based on the control signal 120 from the RF front end controller 108.

Figure 2:
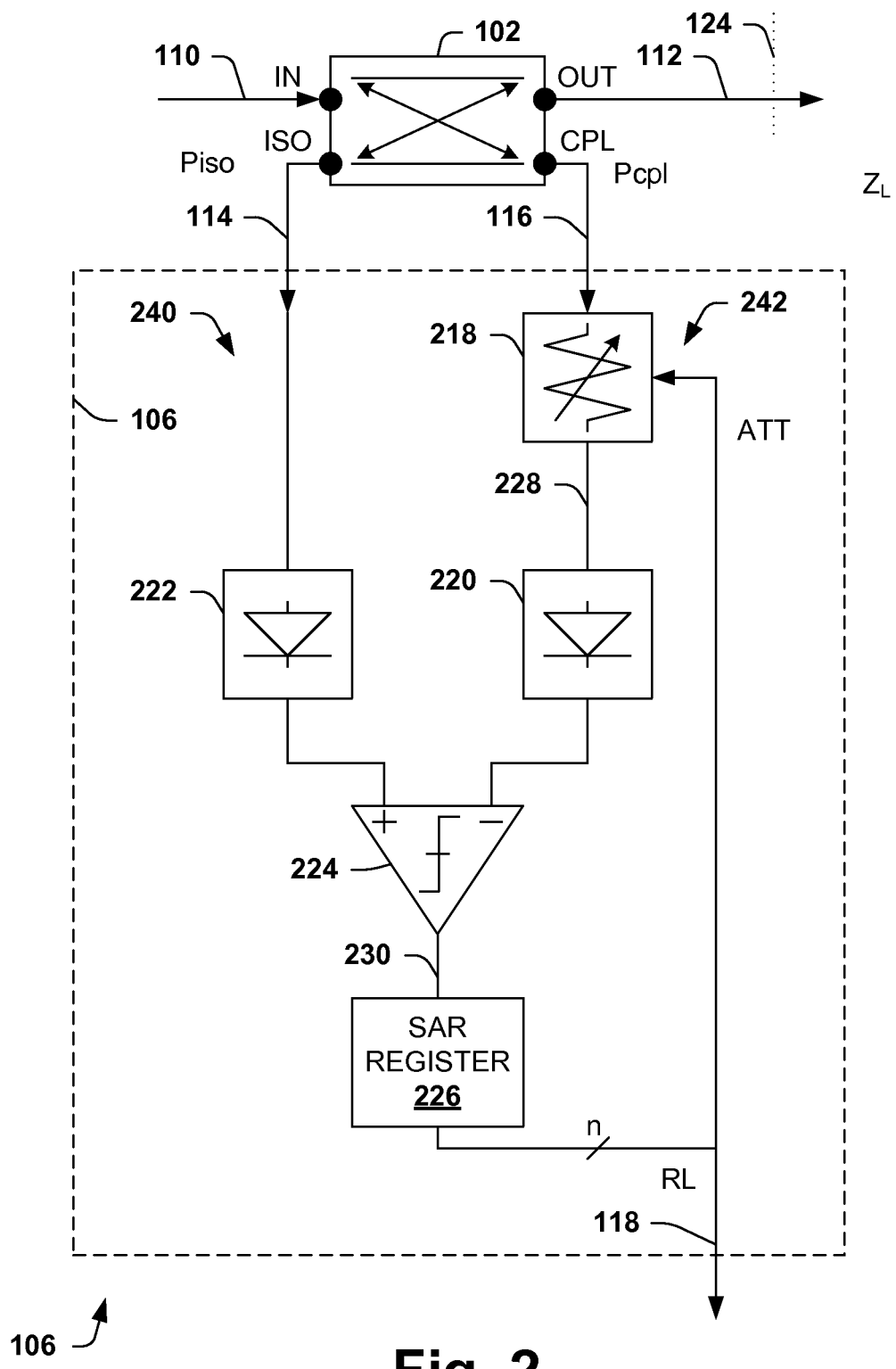
FIG. 2 is a diagram illustrating an analog standing wave ratio detector.

FIG. 2 is a diagram illustrating an analog standing wave ratio detector 106. The detector 106 compares analog power measurements based on a couple signal and an isolated signal to generate a return loss, which represents a standing wave ratio.

The detector 106 generates a return loss or standing wave ratio 118 based on an isolated signal 114 and a coupled signal 116. The detector 106 includes an attenuation component 218, a coupled power detector 220, an isolated power detector 222, a comparator 224 and a successive approximation (SAR) register 226.

The detector 106 is coupled to a directional coupler 102. Operation of the directional coupler 102 is substantially as described above with regard to FIG. 1.

The attenuation component 218 includes adjustable circuitry configured to reduce a power of the coupled signal 116 to more closely match a power of the isolated signal 114. The circuitry can include, for example, an adjustable resistor that controllably reduces power. The amount of attenuation ATT is set by the SAR register 226. In one example, ATT is specified in decibels. The amount of attenuation ATT is typically provided in digital to the attenuation component 218. The attenuation component 218 generates an attenuated version 228 of the coupled signal 116 based on the amount of attenuation ATT.

The coupled power detector 220 measures/detects power of the attenuated signal 228, which has been derived from the coupled signal 116. The isolated power detector 222 measures/detects power of the isolated signal 118. The power detectors 220 and 222 are analog and provide their measurements in analog form as well. The coupled power detector 220 generates a coupled power as a voltage while the isolated power detector 222 generates an isolated power as a voltage measurement.

The comparator 224 compares the coupled power Pcpl with the isolated power Piso and generates a comparator output 230. This output or value is stored within the SAR register 226.

The SAR register 226 sequentially generates the return loss signal RL in n steps as a multi bit value having n bits. The process is referred to as successive approximation. Each step or the i-th step sets the i-th to a high state and reads out the comparator 224. If the comparator output 230 indicates that Pcpl is larger than the Piso, the SAR register 226 leaves the i-th bit of the return loss signal RL "high", which is also the ATT signal. If the comparator output 230 indicates that Pcpl is lower than the Piso, the SAR register 226 changes the i-th bit of the return loss signal RL to "low". The conversion process starts from a most significant bit of the return loss signal RL (i=n−1) and ends at a least significant bit (i=0). At the end of the conversion process, the multi-bit return loss signal RL indicates the return loss from the reference plane 124. The reference plane 124 is shown downstream of the OUT port of the directional coupler 102.

It is noted that the return loss RL 118 and the attenuation amount ATT signal are shown connected on the same line. It is appreciated that the return loss 118 can be provided on a separate line or output from the attenuation amount ATT signal.

A controller (not show), such as the controller 108, is configured to perform the conversion process of the detector 106 using the SAR register 226 and indicate when the conversion process is complete and the n digit RL signal is complete. The controller can be part of the detector 106 or be external to the detector 106.

Once deemed accurate or complete by performing n iterations, the signal RL is used by an RF front end controller (not shown) to control an antenna tuner (not shown).

Operation of the detector 106 is described in mathematical terms and with reference to FIG. 2. The RF input signal 110 is applied to the IN port of the coupler 102 has a power referred to as $P_{in}$. The signal 110 is applied at the IN port and couples out at the CPL port as $P_{CPL}$. The relationship is represented as:

$$P_{CPL} = P_{in} - CPL$$

where CPL is a coupling factor of the directional coupler 102.

The OUT port, also referred to as the transmitted port of the coupler, is loaded with an impedance ZL exhibiting the reflection loss RL. Part of the transmitted power $P_{in}$ reflects back to the directional coupler 102 and appears at the ISO port as:

$$P_{ISO} = P_{in} - RL - CPL$$

For a passive load on the OUT port:

$$P_{ISO} \leq P_{CPL}$$

2 special cases
1) $P_{ISO} = P_{CPL}$ in case of complete reflection, such as when there is complete reflection and ZL is open or short
2) $P_{ISO} \leq -\infty dB$, in the case of matching of ZL to a characteristic impedance (also, $P_{ISO} \ll P_{CPL}$)

Operation of the detector 106 in one example, is described here using the above equations. The example is given for the detector 106 comprising the attenuator which can be set to any arbitrary attenuation coefficient. This example is provided for illustrative purposes and it is appreciated that other suitable examples and variations are contemplated.

1.) Set a value $$ATT = \frac{A_{max}}{2},$$

where $A_{max}$ is the maximum attenuator value; set $i=n-1$, where n is the resolution of the SAR register 226.

1.) The steps 2-6 are repeated n times, where n is the resolution or accuracy of the SAR register 226.

2.) The attenuator component 218 is set to the value ATT and $I=i-1$.

3.) The isolated detector 222 rectifies the isolated signal 114 to generate a voltage referred to as $V_{iso.att.dc}$. The coupled detector 220 rectifies the attenuated signal 228 to generate a voltage referred to as $V_{cpl.att.dc}$.

4.) The voltages $V_{iso.att.dc}$ and $V_{cpl.att.dc}$ are compared.

5.) If $V_{iso.att.dc} < V_{cpl.att.dc}$, then set $$ATT = ATT + \frac{A_{max}}{2^{n-i}}$$

6.) If $V_{iso.att.dc} > V_{cpl.att.dc}$, then set $$ATT = ATT - \frac{A_{max}}{2^{n-i}}$$

7.) The provided value of ATT corresponds to the return loss from load impedance (RL=ATT).

Knowing the return loss RL, the standing wave ratio is obtained as a voltage VSWR according to:

$$VSWR = \frac{1 + 10^{-RL/20}}{1 - 10^{-RL/20}}$$

Thus, the VSWR is obtained without analog to digital conversions being required.

Operation of the detector 106 in another example, is described here. The example is given for the detector 106 comprising the attenuator which can be set to any of the predefined attenuation coefficients. The predefined attenuation coefficients are typically binary-weighted attenuation coefficients. This example is provided for illustrative purposes and it is appreciated that other suitable examples and variations are contemplated.

Set $i=0$; ATT=0

1.) Set $i=i+1$; set ATT=ATT+$2^{n-i}$. $A_{LSB}$, where $A_{LSB}$ is the attenuation value corresponding to the least significant bit of the digitally-controllable attenuator, n is the resolution of the SAR register 226.

2.) The attenuator component 218 is set to the value ATT.

3.) The isolated detector 222 rectifies the isolated signal 114 to generate a voltage referred to as $V_{iso.att.dc}$. The coupled detector 220 rectifies the attenuated signal 228 to generate a voltage referred to as $V_{cpl.att.dc}$.

4.) The voltages $V_{iso.att.dc}$ and $V_{cpl.att.dc}$ are compared.

5.) If $V_{iso.att.dc} > V_{cpl.att.dc}$, then set ATT=ATT-$2^{n-i}$. $A_{LSB}$

6.) If $i<n$, repeat 1-6.

7.) The provided value of ATT corresponds to the return loss from load impedance (RL 118=ATT).

Figure 3:
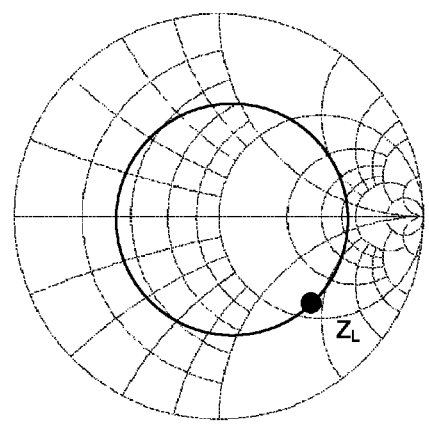
FIG. 3 is a smith chart showing a detected VSWR.

FIG. 3 is a smith chart 300 showing a detected VSWR. The chart 300 is provided in order to facilitate understanding and it is appreciated that other impedances and values can be obtained.

The chart 300 includes a ring or circuit on which a measured impedance $Z_L$ is located. The ring is referred to as a VSWR circle. In some embodiments, the center of the VSWR circle is located in the middle of the smith chart. In some embodiments, the VSWR circle may have a form of an oval with the geometric center in the middle of the smith chart or in any arbitrary point of the smith chart.

Figure 4:
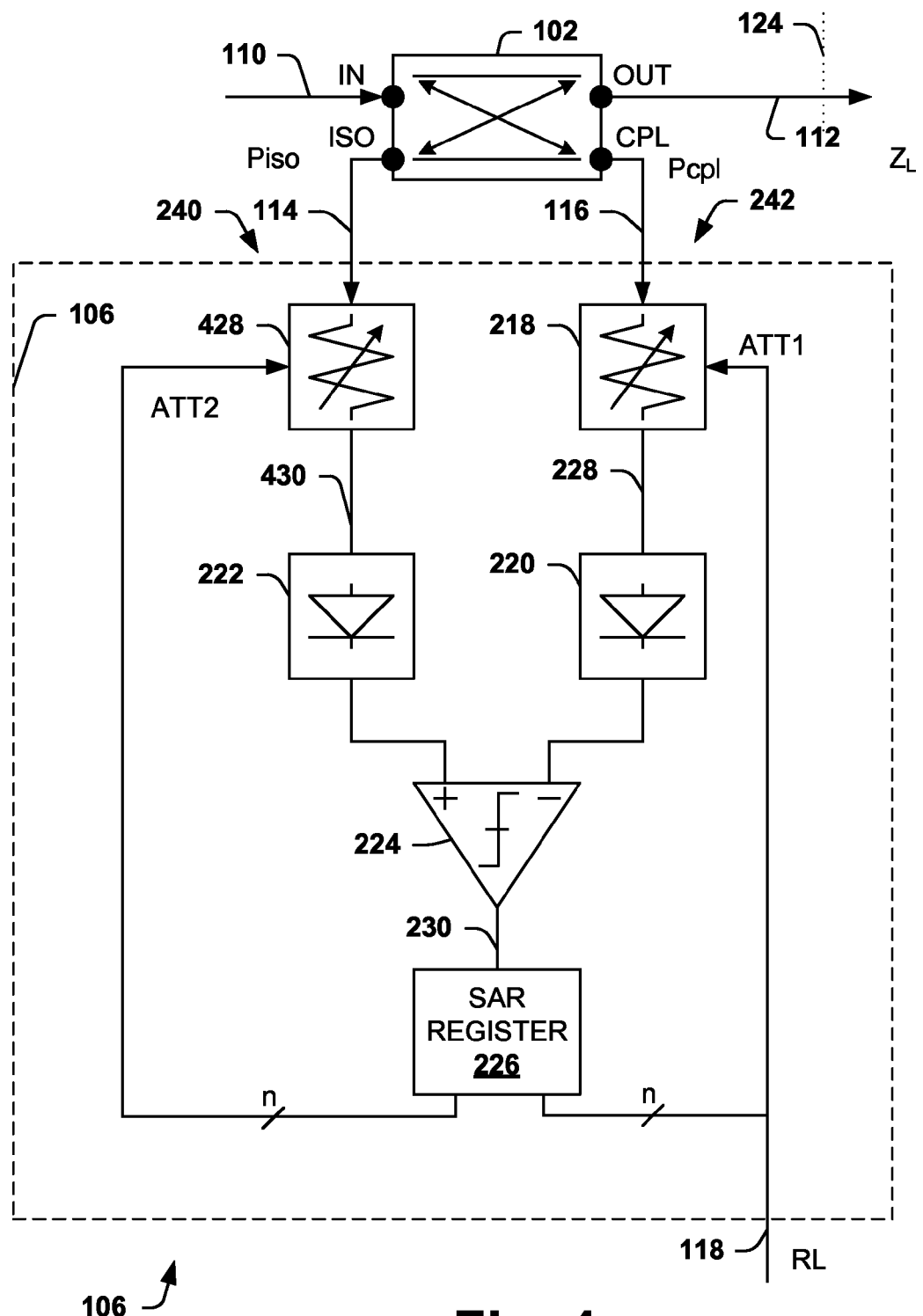
FIG. 4 is a diagram illustrating an analog standing wave ratio detector.

FIG. 4 is a diagram illustrating an analog standing wave ratio detector 106. The detector 106 compares analog power measurements based on a coupled signal and an isolated signal to generate a return loss, which represents a standing wave ratio. The detector 106 uses multiple attenuation components.

The detector 106 generates a return loss or standing wave ratio 118 based on an isolated signal 114 and a coupled signal 116. The detector 106 includes an attenuation component 218, an isolated attenuation component 428, a coupled power detector 220, an isolated power detector 222, a comparator 224 and a register 226.

The detector 106 is coupled to a directional coupler 102. Operation of the directional coupler 102 is substantially as described above with regard to FIG. 1.

The attenuation component 218, also referred to as the coupled attenuation component, includes adjustable circuitry configured to reduce a power of the coupled signal 116. The amount of attenuation is set by the RL signal 118 and, in one example, is specified in decibels. The attenuation component 218 generates an attenuated version 228 of the coupled signal 116.

The isolated attenuation component 428 also includes adjustable circuitry configured to reduce a power of the isolated signal 114. The circuitry can include, for example, an adjustable resistor that controllably reduces power. The amount of attenuation is set by the RL signal 118 and, in one example, is specified in decibels. The isolated attenuation component 428 generates an attenuated version 430 of the isolated signal 114.

The coupled power detector 220 measures/detects power of the attenuated signal 228, which has been derived from the coupled signal 116. The isolated power detector 222 measures/detects power of the attenuated signal 330. The power detectors 220 and 222 are analog and provide their measurements in analog form as well. The coupled power detector 220 generates a coupled power as a voltage measurement while the isolated power detector 222 generates an isolated power as a voltage measurement.

The comparator 224 compares the coupled power Pcpl with the isolated power Piso and generates a comparator output 230. This output is stored within the SAR register 226.

The SAR register 226 provides the return loss signal RL or standing wave ratio 118 as a multi bit value having n bits. The signal 118 is used to adjust the attenuator component 218 and is also used by an RF front end controller (not shown) to control an antenna tuner (not shown).

Operation of the detector 106 is described in mathematical terms and with reference to FIG. 4.

This example is provided for illustrative purposes and it is appreciated that other suitable examples and variations are contemplated.

1.) The steps 2-7 are repeated n times, where n is the resolution of the SAR register 226.

2.) Set a value $$ATT1 = \frac{A_{max}}{2}$$

and $$ATT2 = \frac{A_{max}}{2},$$

where $A_{max}$ is the maximum attenuator value; set i=n−1, where n is the resolution of the SAR register 226.

3.) The coupled attenuator component 218 is set to the value ATT1, the isolated attenuator component 428 is set to the value ATT2 and i=i−1.

4.) The isolated detector 222 rectifies the attenuated isolated signal 330 to generate a voltage referred to as $V_{iso.att.dc}$. The coupled detector 220 rectifies the attenuated signal 228 to generate a voltage referred to as $V_{cpl.att.dc}$.

5.) The voltages $V_{iso.att.dc}$ and $V_{cpl.att.dc}$ are compared.

6.) If $V_{iso.att.dc} < V_{cpl.att.dc}$, then set $$ATT1 = ATT1 + \frac{A_{max}}{2^{n-i}}$$

and $$ATT2 = ATT2 - \frac{A_{max}}{2^{n-i}}$$

7.) If $V_{iso.att.dc} > V_{cpl.att.dc}$, then set $$ATT1 = ATT1 - \frac{A_{max}}{2^{n-i}}$$

and $$ATT2 = ATT2 + \frac{A_{max}}{2^{n-i}}$$

8.) The difference between ATT1 and ATT2 is the return loss RL 118, shown as:

$$RL = ATT1 - ATT2$$

The RL value provided corresponds to the return loss from load impedance. Knowing the return loss RL, the standing wave ratio is again obtained as a voltage VSWR according to:

$$VSWR = \frac{1 + 10^{-RL/20}}{1 - 10^{-RL/20}}$$

Alternately, the VSWR can be determined using another suitable mechanism. In one example, a lookup table with VSWR values are stored with associated RL values. The lookup table can be incorporated with analog standing wave ratio detector or a controller in antenna tuning arrangement.

Figure 5:
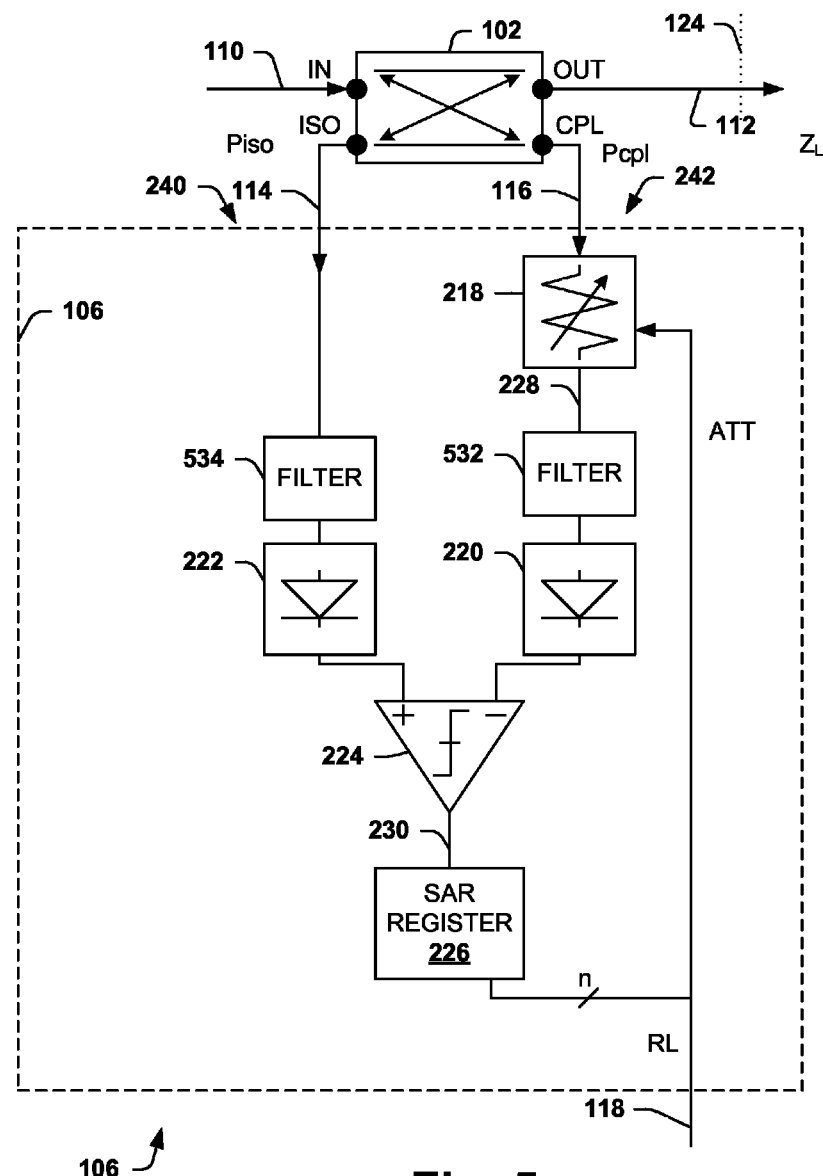
FIG. 5 is another diagram illustrating an example analog standing wave ratio detector with blocking filters.

FIG. 5 is another diagram illustrating an example analog standing wave ratio detector 106 with blocking filters. The detector 106 compares analog power measurements based on a coupled signal and an isolated signal to generate a return loss, which represents a standing wave ratio. The detector 106 uses blocking filters for the isolated signal path and the coupled signal path. The blocking filters selectively remove noise and/or interference.

The detector 106 generates a return loss RL signal based on an isolated signal 114 and a coupled signal 116. The detector 106 includes an attenuation component 218, a coupled filter 532, an isolated filter 534, a coupled power detector 220, an isolated power detector 222, a comparator 224 and a register 226.

The detector 106 is coupled to a directional coupler 102. Operation of the directional coupler 102 is substantially as described above with regard to FIG. 1. Operation of the detector 106 is also substantially as described above with regard to FIG. 2.

Additionally, the isolated filter 534 filters the isolated signal 114 to remove interference, such as WiFi interference. The isolated filter 534 can be a notch filter, low-pass filter, high pass filter, band pass filter and the like. In one example, the isolated filter 534 is a notch filter at 2.4 GHz or 5 GHz and is configured to suppress WiFi interference.

Similarly, the coupled filter 532 filters the coupled signal 116 to remove interference, such as WiFi interference. The coupled filter 532 can be a notch filter, low-pass filter, high pass filter, band pass filter and the like. In one example, the coupled filter 532 is a notch filter at 2.4 GHz or 5 GHz and is configured to suppress WiFi interference.

It is noted that the power detectors 220 and 222 are not typically frequency selective and will deliver information based on the signals provided by the filters 532 and 534. The filters 532 and 534 are also referred to as blocker filters in that they are configured to block interference.

Figure 6:
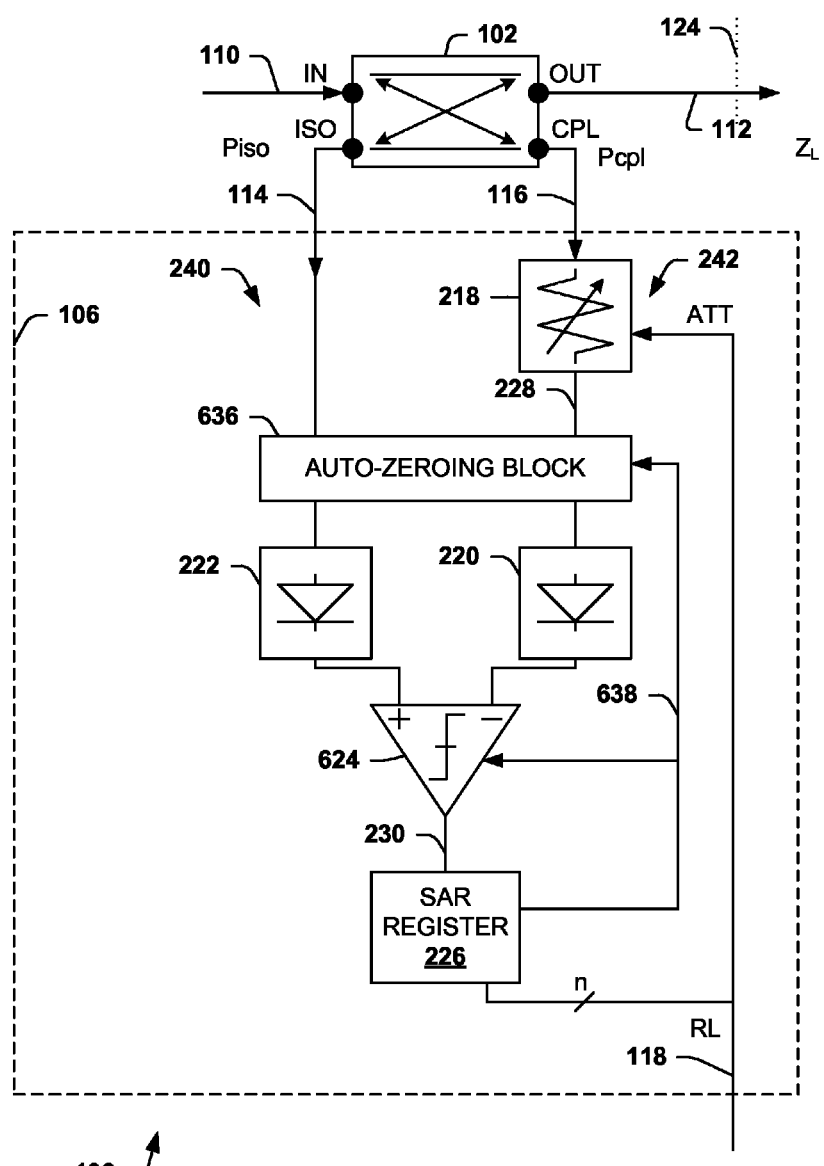
FIG. 6 is diagram illustrating an example analog standing wave ratio detector with an auto-zeroing comparator.

FIG. 6 is diagram illustrating an example analog standing wave ratio detector 106 with an auto-zeroing comparator. The detector 106 compares analog power measurements based on a coupled signal and an isolated signal to generate a return loss, which represents a standing wave ratio.

The detector 106 generates a return loss RL based on an isolated signal 114 and a coupled signal 116. The detector 106 includes an attenuation component 218, an auto-zeroing block 636, a coupled power detector 220, an isolated power detector 222, an auto-zeroing comparator 624 and a register 226.

The detector 106 is coupled to a directional coupler 102. Operation of the directional coupler 102 is substantially as described above with regard to FIG. 1.

Operation of the detector 106 is also substantially as described above with regard to FIG. 2. However, the detector 106 operates and performs detection in two phases, an auto-zeroing phase and a comparison phase.

The detector 106 also includes an auto-zeroing block 636 and the comparator is an auto-zeroing comparator 624. The auto-zeroing block 636 includes circuitry configured to selectively connect and/or isolate the power detectors 222 and 220 from the isolated path and signal 114 and the coupled path and signal 116. The auto-zeroing comparator 624 includes circuitry configured to measure and combine offsets and utilizes the combined offset for measuring the return load.

In the auto-zeroing phase, the power detectors 222 and 220 are disconnected or isolated from the isolated signal 114 and the coupled signal 116 by the auto-zeroing block 636. Their output voltages are applied to the auto-zeroing comparator 624, which generates a difference between the voltages, referred to as the power detectors offset. Additionally, the auto-zeroing comparator 624 extracts an internal offset and adds the internal offset to the power detectors offset. The combined offset is stored in the auto-zeroing comparator 624.

In the comparison phase, the auto-zeroing comparator 624 adds the stored offset voltage to one of the output voltages from the power detectors 222 and 220 and compares the result with the output voltage from the other power detector. Successive approximation is used with an auto-zeroing phase and a comparison phase for each iteration/approximation in order to generate a return loss RL with suitable accuracy.

It is appreciated that the detector 106 can also use blocking filters for the isolated signal path and the coupled signal path. The blocking filters selectively remove noise and/or interference.

Figure 7:
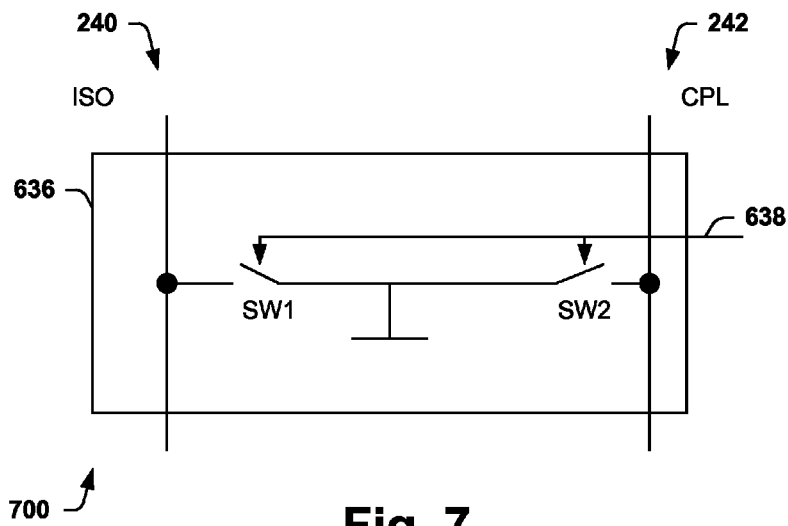
FIG. 7 is a diagram illustrating an arrangement of an auto-zeroing block.

FIG. 7 is a diagram illustrating an arrangement 700 of an auto-zeroing block 636. The block 636 permits an auto-zeroing phase and a comparison phase, as described in FIG. 6. In this arrangement 700, shunt RF switches are used to selectively attenuate incoming signals, such as the isolated signal 114 and the coupled signal 116. A control signal 638, shown in FIG. 6, is used to selectively turn the switches ON and OFF.

The auto-zeroing block 636 lies along the isolated signal path 240 and the coupled signal path 242 prior to the power detectors. The block 636 includes a first shunt RF switch SW1 and a second shunt RF switch SW2. The switches SW1 and SW2, when ON attenuate power from the incoming signals by an amount, such as 5-40 dB. The switches SW1 and SW2 are turned ON during the auto-zeroing phase.

During the comparison phase, the switched SW1 and SW2 are turned OFF and the incoming signals are not attenuated. The incoming signals pass through to the power detectors unaltered.

Figure 8:
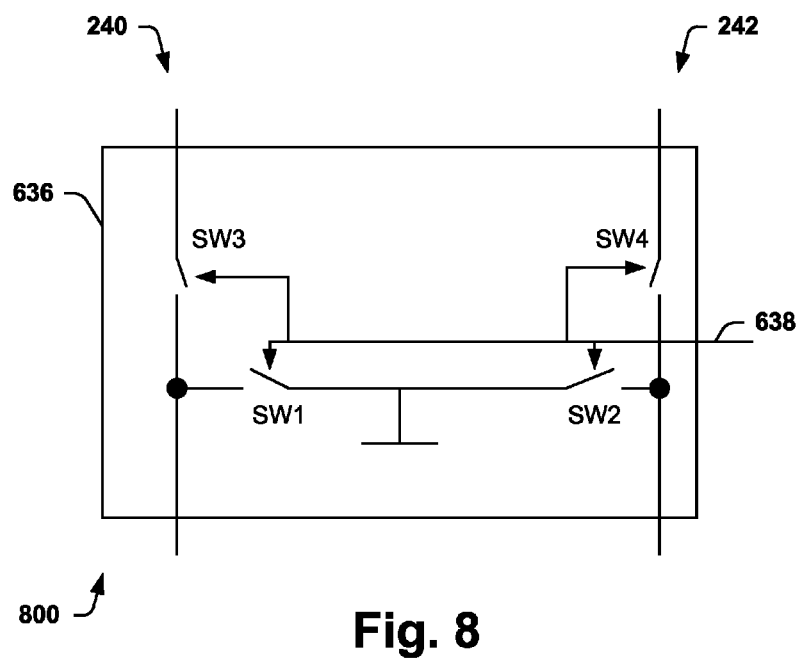
FIG. 8 is a diagram illustrating an arrangement of an auto-zeroing block.

FIG. 8 is a diagram illustrating an arrangement 800 of an auto-zeroing block 636. The block 636 permits an auto-zeroing phase and a comparison phase, as described in FIG. 6. In this arrangement 800, shunt RF switches and series switches are used to selectively attenuate and/or isolate incoming signals, such as the isolated signal 114 and the coupled signal 116.

The auto-zeroing block 636 lies along the isolated signal path 240 and the coupled signal path 242 prior to the power detectors. The block 636 includes a first shunt RF switch SW1 and a second shunt RF switch SW2. The block 636 additionally includes a series switch SW3 and a series switch SW4.

During the auto-zeroing phase, the switches SW1 and SW2 are turned ON and the switches SW3 and SW4 are turned OFF. Thus, the incoming signals are isolated and the output terminals are shunted to a reference node via the switches SW1 and SW2. The power is attenuated by, for example, 20 to 60 dB.

During the comparison phase, the switched SW1 and SW2 are turned OFF and the incoming signals are not attenuated. The incoming signals pass through to the power detectors unaltered.

Figure 9:
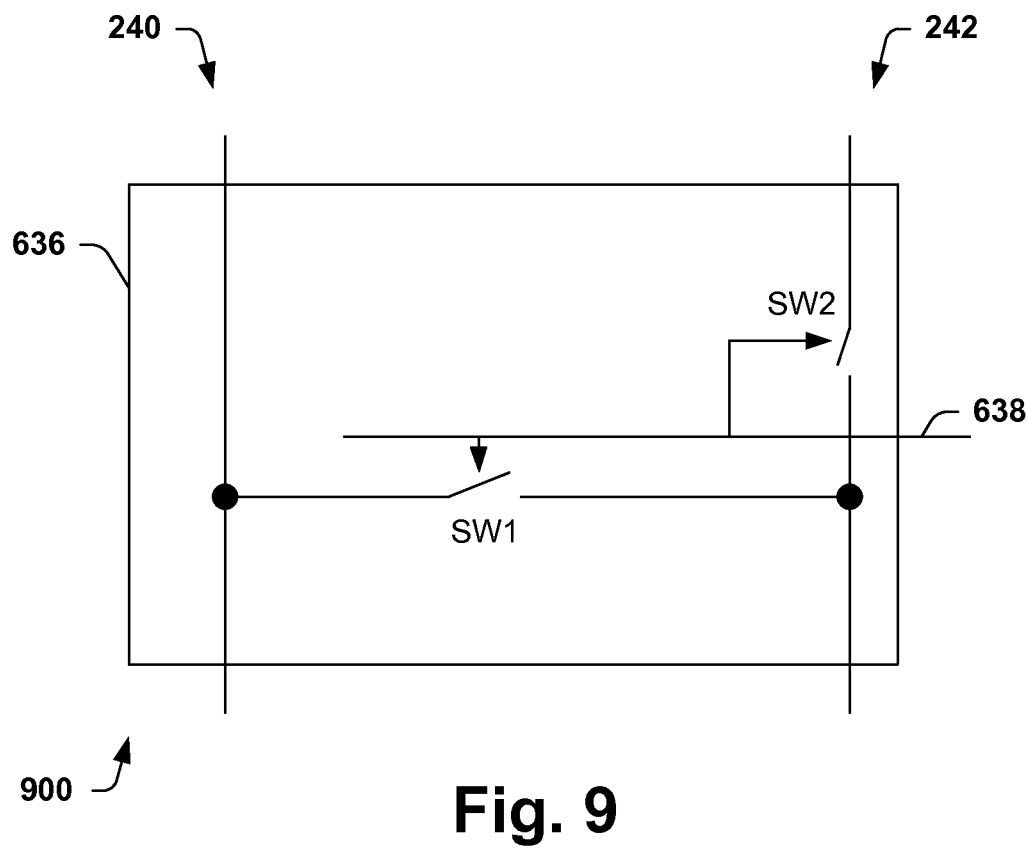
FIG. 9 is a diagram illustrating an arrangement of an auto-zeroing block.

FIG. 9 is a diagram illustrating an arrangement 900 of an auto-zeroing block 636. The block 636 permits an auto-zeroing phase and a comparison phase, as described in FIG. 6. In this arrangement 900 only a shunt RF switch SW1 and a series switch SW2 are used to selectively attenuate and/or isolate incoming signals, such as the isolated signal 114 and the coupled signal 116.

The auto-zeroing block 636 lies along the isolated signal path 240 and the coupled signal path 242 prior to the power detectors.

During the auto-zeroing phase, the switch SW1 is turned ON and the switch SW2 is turned OFF. Thus, the incoming non-isolated signal path 242 is detached from the detector, instead the isolated signal path 240 is attached to the detector in non-isolated signal path. Thus, the same isolated signal is applied to both power detectors during the auto-zeroing phase. The power isolation between the isolated signal path 240 and non-isolated signal path 242 is, for example, 5 to 50 dB.

During the comparison phase, the switched SW1 is tuned OFF and SW2 is turned ON. The incoming signals pass through to the power detectors unaltered.

Figure 10:
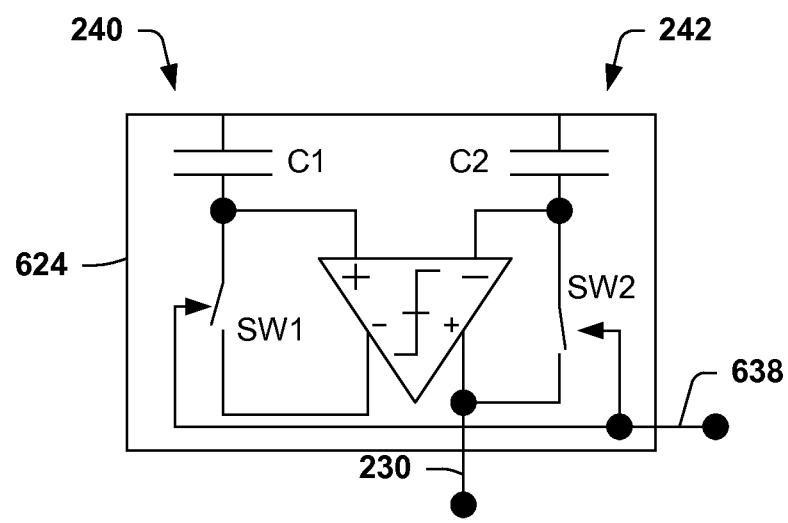
FIG. 10 is a diagram illustrating an example auto-zeroing comparator.

FIG. 10 is a diagram illustrating an example auto-zeroing comparator 624. The comparator 624 lies along the isolated signal path 240 and the coupled signal path 242. The comparator 624 receives the signals/voltages from the power detectors 222 and 220.

During the auto-zeroing phase, switches SW1 and SW2 are turned ON. The combined power detectors offset and the comparator's offset are stored on the series capacitors C1 and C2 in the signal paths 240 and 242. During the comparison phase, the switches SW2 and SW1 are turned OFF. The switches SW1 and SW2 are controlled by the control signal 638.

Figure 11:
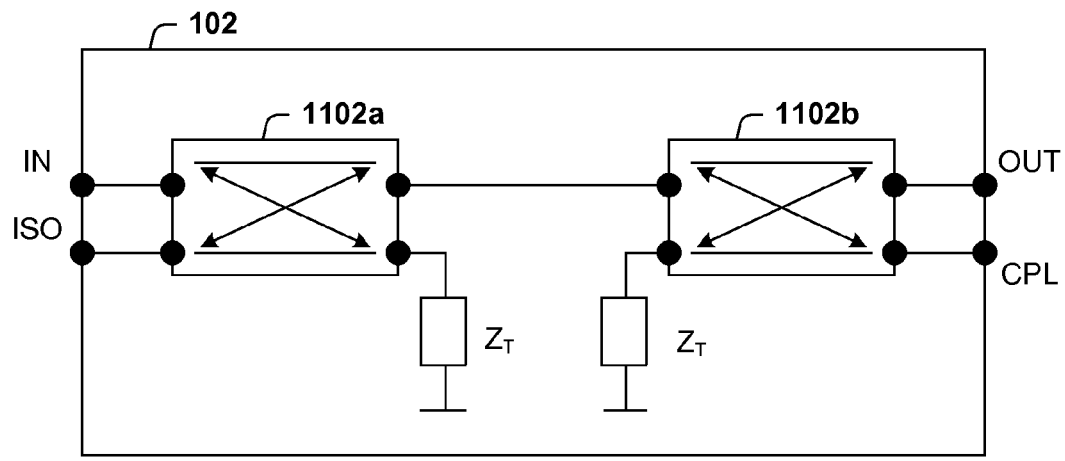
FIG. 11 is a diagram illustrating a directional coupler arrangement having multiple cells and a termination impedance.

FIG. 11 is a diagram illustrating a directional coupler arrangement 1100 having multiple cells and a termination impedance. This arrangement can be used as the directional coupler 102 in the examples above.

The arrangement includes a first cell 1102a and a second cell 1102b. The first cell 1102a has IN and ISO ports connected to IN and ISO ports of the arrangement. An OUT port of the first cell 1102a is connected to an IN port of the second cell 1102b. A CPL port of the first cell 1102a is connected to a termination impedance $Z_T$.

The second cell 1102b has its ISO port connected to a termination impedance $Z_T$, its OUT port connected to an OUT port of the arrangement 1100 and its CPL port connected to a CPL port of the arrangement 1100.

The first and second cells 1102a and 1102b can be implemented as magnetically-coupled transformer with inter-winding capacitances.

Figure 12:
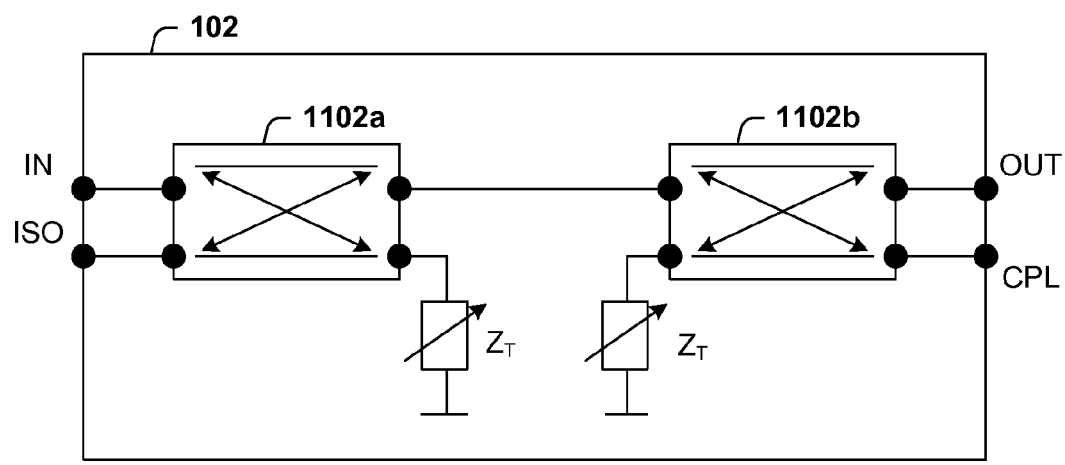
FIG. 12 is a diagram illustrating a directional coupler arrangement having multiple cells and an adjustable termination impedance.

FIG. 12 is a diagram illustrating a directional coupler arrangement 1200 having multiple cells and an adjustable termination impedance. This arrangement can be used as the directional coupler 102 in the examples and arrangements shown above.

The arrangement includes a first cell 1202a and a second cell 1202b. The first cell 1202a has IN and ISO ports connected to IN and ISO ports of the arrangement. An OUT port of the first cell 1202a is connected to an IN port of the second cell 1202b. A CPL port of the first cell 1202a is connected to a first adjustable termination impedance $Z_T$.

The second cell 1202b has its ISO port connected to a second adjustable termination impedance $Z_T$, its OUT port connected to an OUT port of the arrangement 1200 and its CPL port connected to a CPL port of the arrangement 1200.

The first and second cells 1202a and 1202b can be implemented as magnetically-coupled transformer with inter-winding capacitances.

In operation, the adjustable termination impedance can be set to a first value to generate a first VSWR. Then, the adjustable termination impedance is set to a second value to generate a second VSWR.

In some embodiments, the first and the second generated VSWRs may correspond to the first and second VSWR circles in a form of an oval with the geometric centers in arbitrary points of the smith chart.

Figure 13:
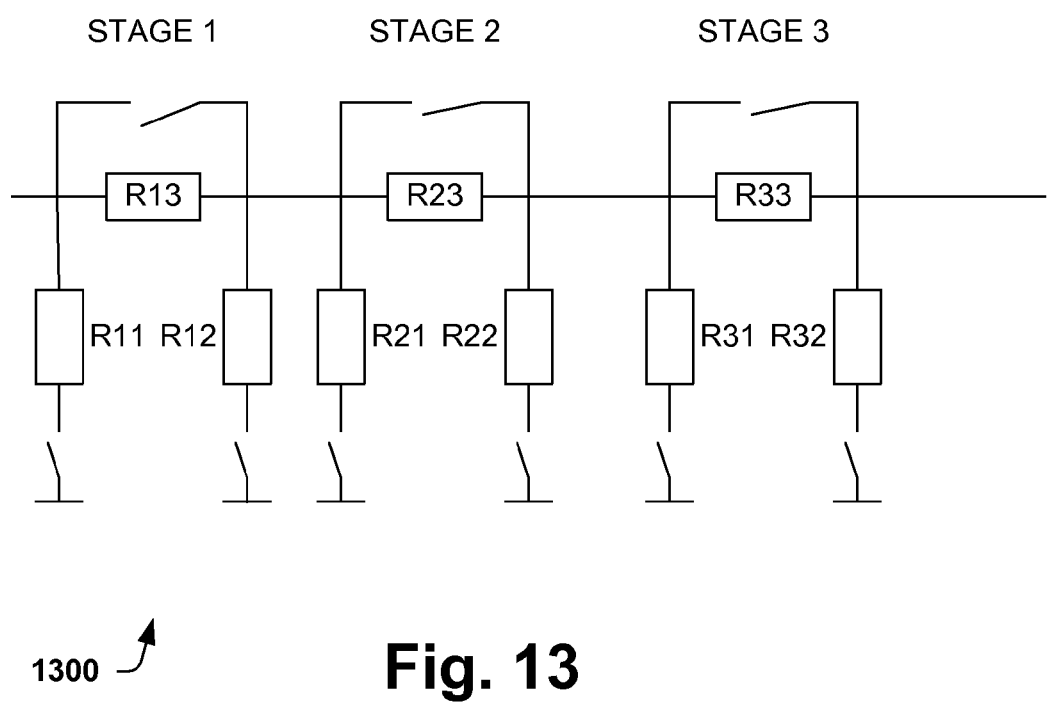
FIG. 13 is a diagram illustrating an example attenuator component.

FIG. 13 is a diagram illustrating an example attenuator component 1300. This component 1300 can be used as the attenuator component 218 as the attenuator component 428 shown above.

The attenuator component 1300 is a multi-stage attenuator and is shown with only three stages for illustrative purposes. Each stage includes a plurality of resistors and a plurality of switches. An upper switch is used to bypass the stage when set to ON. When not bypassed, the lower switches are configured to determine or set an attenuation for the stage.

Figure 14:
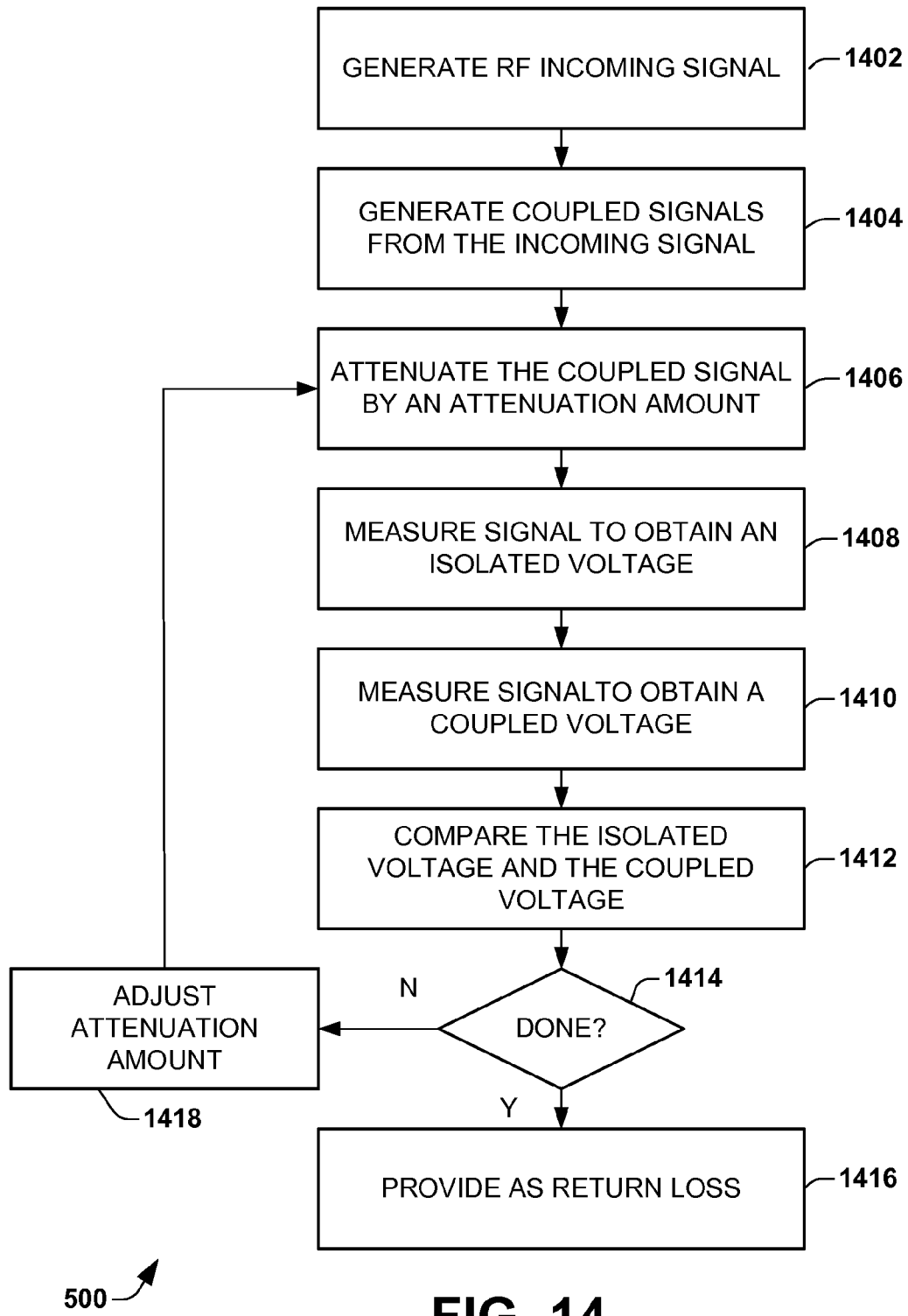
FIG. 14 is a flow diagram illustrating a method of operating a standing wave ratio detector.

FIG. 14 is a flow diagram illustrating a method 1400 of operating a standing wave ratio detector. The method 1400 generates a standing wave ratio for an incoming RF signal. The standing wave ratio can be used for impedance matching of RF signal generation circuitry and an antenna for transmission.

RF signal generation circuitry generates an RF incoming signal at block 1402. The RF incoming signal can include information modulated using a suitable technique.

A directional coupler uses coupling to generate an isolated signal and a coupled signal from the RF incoming signal at block 1404. The directional coupler also provides an RF output signal.

The coupled signal is attenuated by an attenuation amount at block 1406. An attenuation component can be used to attenuate the coupled signal. The attenuation amount is initially set to a starting or initial value.

The isolated signal is measured at block 1408 to obtain an isolated voltage. A power detector or other suitable device can be used to measure and obtain the isolated voltage.

The coupled signal is measured at block 1410 to obtain a coupled voltage. A power detector or other suitable device can be used to measure and obtain the coupled voltage.

The coupled voltage and the isolated voltage are compared at block 1412 to generate a comparison value or output. If the coupled voltage is greater than the isolated voltage, a current bit is set to high. If the coupled voltage is less than the isolated voltage, the current bit is set to low. The current bit is stored in a register.

A check is done at block 1414 to see if that was the last iteration. In one example, each iteration is designated with i and increases at i=i+1 until i=n.

After the last sequence or iteration, a return loss is provided as a multi-bit signal at block 1416. A standing wave ratio or voltage standing wave ratio can be determined from the return loss via a formula or other suitable mechanism.

If another sequence or iteration is needed, the attenuation amount is adjusted at block 1418 and the method returns to block 1406. The attenuation amount can be adjusted as shown above with regard to FIG. 2.

It is appreciated that variations of the method 1400 are contemplated, such as including functionality and features of the above described arrangements and systems.

While the method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

It is appreciated that the claimed subject matter may be implemented as a method, apparatus, or article of manufacture using standard programming and/or engineering techniques to produce software, firmware, hardware, or any combination thereof to control a computer to implement the disclosed subject matter (e.g., the systems, arrangements and the like shown in FIGS. 1, 2, etc., are non-limiting examples that may be used to implement the above methods). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

In addition, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

A standing wave ratio detection arrangement is disclosed. The arrangement includes a standing wave ratio detector and a controller. The standing wave ratio detector is configured to receive an isolated signal and a coupled signal and to generate a multi-bit return loss signal based on the isolated signal and the coupled signal in the analog domain using successive attenuation of the coupled signal. The controller is configured to determine a standing wave ratio from the return loss and to generate an antenna tuner control signal using the standing wave ratio.

An antenna tuner arrangement is disclosed. The arrangement includes a directional coupler, a standing wave ratio detector, and an antenna tuner. The directional coupler is configured to generate an isolated signal and a coupled signal from an RF input signal. The standing wave ratio detector has an attenuator, a first power detector, a second power detector, a comparator and a register. The attenuator is configured to attenuate the coupled signal by an attenuation amount. The first power detector is configured to measure an isolated voltage of the isolated signal. The second power detector is configured to measure a coupled voltage of the coupled signal. The comparator is configured to provide a comparison of the isolated voltage and the coupled voltage as an output. The register is configured to store at least a portion of a return loss based on the comparison. The antenna tuner is configured to adjust an antenna impedance based on the return loss.

A method of operating a standing wave ratio detector is disclosed. A first coupled signal and a second coupled signal are received. The second coupled signal is attenuated by an attenuation amount. The power of the first coupled signal is measured as a first voltage. The power of the second coupled signal is measured as a second voltage. The first voltage and the second voltage are compared to generate a comparison value. The attenuation amount is adjusted based on the comparison value. The attenuation amount is stored. The attenuation amount is provided as a return loss from a reference plane.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A standing wave ratio detection arrangement comprising:
    a standing wave ratio detector configured to receive an isolated signal and a coupled signal, to compare an isolated power of the isolated signal with a coupled power of the coupled signal and to generate a multi-bit return loss signal based on the comparison of the isolated power and the coupled power in the analog domain using successive attenuation of the coupled signal; and
    a controller configured to determine a standing wave ratio from the multi-bit return loss signal and to generate an antenna tuner control signal using the standing wave ratio.

2. The arrangement of claim 1, further comprising a directional coupler configured to receive an incoming RF signal and generate the isolated signal and the coupled signal using coupling.

3. The arrangement of claim 2, further comprising an antenna tuner configured to enhance impedance matching according to the antenna tuner control signal.

4. The arrangement of claim 1, wherein the controller is configured to control the successive approximation of the standing wave ratio detector.

5. The arrangement of claim 1, wherein the standing wave ratio detector includes a first power detector configured to measure the isolated power of the isolated signal, a second power detector configured to measure the coupled power of the coupled signal, and an attenuator component configured to selectively attenuate the coupled signal.

6. The arrangement of claim 5, wherein the standing wave ratio detector includes a comparator configured to compare the isolated power and the coupled power.

7. The arrangement of claim 5, wherein the standing wave ratio detector further includes a second attenuator component configured to selectively attenuate the isolated signal.

8. The arrangement of claim 7, wherein the standing wave ratio detector further includes a register configured to store the return value.

9. The arrangement of claim 7, wherein the standing wave ratio detector includes a first filter configured to remove interferences from the coupled signal and a second filter configured to remove interferences from the isolated signal.

10. The arrangement of claim 1, wherein the standing wave ratio detector is configured to operate in an auto-zeroing phase where the isolated signal and the coupled signal are attenuated and a detector offset is determined and the standing wave ratio detector is also configured to operate in a comparison phase where the detector offset is used to generate a return value.

11. The arrangement of claim 10, further comprising an auto-zeroing component configured to attenuate the isolated signal and the coupled signal during the auto-zeroing phase.

12. A standing wave ratio detection arrangement comprising:
    a standing wave ratio detector configured to receive an isolated signal and a coupled signal and to generate a multi-bit return loss signal based on the isolated signal and the coupled signal in the analog domain using successive attenuation of the coupled signal; and
    a controller configured to determine a standing wave ratio from the multi-bit return loss signal and to generate an antenna tuner control signal using the standing wave ratio;
    a directional coupler configured to receive an incoming RF signal and generate the isolated signal and the coupled signal using coupling; and
    wherein the directional coupler includes a first cell and a second cell, wherein the first cell and the second cell have an adjustable termination impedance and wherein the standing wave ratio detector is configured to generate a first return loss based on a first termination impedance and a second return loss based on a second termination impedance, wherein the first termination impedance is varied from the second termination impedance.

13. An antenna tuner arrangement comprising:
    a directional coupler configured to generate an isolated signal and a coupled signal from an RF input signal;
    a standing wave ratio detector having:
        an attenuator configured to attenuate the coupled signal by an attenuation amount;
        a first power detector configured to measure an isolated voltage of the isolated signal;
        a second power detector configured to measure a coupled voltage of the coupled signal;
        a comparator configured to provide a comparison of the isolated voltage and the coupled voltage as an output; and
        a register configured to store the comparison and one or more additional comparisons as a return loss having a plurality of bits; and
    an antenna tuner configured to adjust an antenna impedance based on the return loss.

14. The arrangement of claim 13, wherein the register is configured to adjust the attenuation amount according to the return loss.

15. The arrangement of claim 13, further comprising a controller configured to successively adjust the attenuation amount until the return loss is within a selected accuracy.

16. The arrangement of claim 13, wherein the comparator is an auto-zeroing comparator and is configured to apply an offset to the comparison.

17. A method of operating a standing wave ratio detector, the method comprising:
    receiving a first coupled signal and a second coupled signal;
    attenuating the second coupled signal by an attenuation amount;

measuring a power of the first coupled signal to obtain a first voltage;

measuring a power of the second coupled signal to obtain a second voltage;

comparing the first voltage with the second voltage to generate a comparison value;

adjusting the attenuation amount based on the comparison value and storing the attenuation amount; and providing the attenuation amount as a return loss from a reference plane.

18. The method of claim 17, further comprising generating a voltage standing wave ratio based on the return loss.

19. The method of claim 17, further comprising attenuating the first coupled signal by a second attenuation amount.

20. The method of claim 17, further comprising generating the first coupled signal and the second coupled signal from an incoming RF signal.

* * * * *